United States Patent [19]
Gwin

[11] Patent Number: 5,494,852
[45] Date of Patent: Feb. 27, 1996

[54] HIGH CAPACITY SEMICONDUCTOR DOPANT DEPOSITION/OXIDIZATION PROCESS USING A SINGLE FURNACE CYCLE

[75] Inventor: Jon A. Gwin, San Antonio, Tex.

[73] Assignee: Sony Electronics Inc., Park Ridge, N.J.

[21] Appl. No.: 98,667

[22] Filed: Jul. 28, 1993

[51] Int. Cl.[6] .................... H01L 21/225; H01L 21/385
[52] U.S. Cl. .................... 437/164; 437/145; 437/248; 437/952; 437/955; 148/DIG. 30; 148/DIG. 35
[58] Field of Search ..................... 437/164, 952, 437/950, 165, 955, 248, 949, 141, 145, 140, 146, 153; 148/DIG. 30, DIG. 35

[56] References Cited

U.S. PATENT DOCUMENTS

| | | | |
|---|---|---|---|
| 3,507,716 | 4/1970 | Nishida et al. | 437/164 |
| 3,676,231 | 7/1972 | Medvecky et al. | 437/164 |
| 3,808,060 | 4/1974 | Hays et al. | 437/952 |
| 3,932,239 | 1/1976 | Brown | 437/952 |
| 4,054,899 | 10/1977 | Stehlin et al. | 437/953 |
| 4,588,454 | 5/1986 | Khadder et al. | 437/162 |
| 4,619,036 | 10/1986 | Havemann et al. | 148/DIG. 10 |
| 5,244,831 | 9/1993 | Hindman et al. | 437/164 |

OTHER PUBLICATIONS

Semiconductor Technology Handbook, Trapp et al., 5th ed., 1985, Technology Assoc., Portola Valley, CA, Bofors Inc., San Mateo, CA, DIF 1–pp. 6.1–6.31.
Wolf. Silicon Processing for the VLSI Era Vol. 1–Process Technology pp. 242–248, and 264–266., Lattace Press 1986.

*Primary Examiner*—Mary Wilczewski
*Assistant Examiner*—H. Jey Tsai
*Attorney, Agent, or Firm*—Jerry A. Miller

[57] ABSTRACT

A semiconductor deposition and oxidation process using a single furnace cycle. The temperature and gas mixture is stabilized inside the furnace prior to introduction of a dopant at a relatively low temperature. The temperature of the chamber is then ramped-up and the dopant is diffused into the wafer in an inert ambient. The temperature is then ramped-up again and oxygen is introduced to produce an oxide layer. The wafers are then removed from the furnace and any residue of the dopant within the chamber is effectively neutralized by introducing a high flow of oxygen.

20 Claims, 1 Drawing Sheet

HIGH CAPACITY SEMICONDUCTOR DOPANT DEPOSITION/OXIDIZATION PROCESS USING A SINGLE FURNACE CYCLE

BACKGROUND

1. Field of the Invention

This invention relates generally to the field of semiconductor processing. More particularly, this invention relates to a method for dopant deposition and oxidation in the semiconductor manufacturing process.

2. Background of the Invention

In semiconductor processing, when the load size is increased in an attempt to get a greater number of semiconductor wafers out of a single process run, a number of problems are encountered. In a dopant deposition and oxidation process, load and radial silicon resistance uniformity of resulting semiconductor wafers is of great concern.

For example, in a conventional semiconductor manufacturing environment, a relatively small number of wafers (e.g. 100 or less) are processed during deposition. When a dopant glass is generated as part of this process, the temperature of a chamber containing the wafers is generally brought up to about 950° C. after which a dopant vapor (e.g. $POCl_3$- phosphorus oxychloride) is generally introduced into the chamber by a carrier gas ($N_2$) at a rate of approximately 225 sccm through a bubbler containing liquid $POCl_3$ at about 25° C. The results of such a process for a relatively small number of wafers is generally acceptable. A test batch produced a resistance variation in the silicon resistance Rs of approximately 3.5% across a single wafer and 3.3% being a typical variation across the load of wafers in one test batch.

Unfortunately, when the size of the batch is increased, the variation in resistance increases substantially resulting in a less predictable process with less predictable circuit performance. In tests conducted using the same process as above and simply increasing the number of wafers used to 250, this resistance variation across a single wafer increased to approximately 27.5% with the variation across the load of wafers of approximately 24.2%. This degradation in variation across a single wafer is thought to be a result of changes in gas flow with the portions of some wafers being exposed to more of the dopant gas than others by virtue of their location within the chamber. For example, some of the wafers will be located adjacent the ports through which the gas is introduced into the chamber, while others are farther away. Also, the distance between wafers is reduced when the load size is increased from 50 to 250. Those located closer to the dopant gas source and the heat source will have exposure to higher concentrations of dopant which are driven into the semiconductor for a somewhat longer period of time.

Another problem with known processes is that the dopant deposition and immediately subsequent dopant diffusion/ oxidization oxidization steps are carried out using two separate furnace cycles. This increases handling and potential damage as well as production time, cost and complexity.

In U.S. Pat. No. 4,588,454 to Khadder et al., the dopant introduction phase of semiconductor processing is carried out by a multiple step process. First, an approximately 1000 Å thick layer of Boron doped glass is deposited on the wafer at a relatively low temperature by introducing a Boron gas ($BCl_3$) in the presence of steam to rapidly (estimated to be approximately 10 to 20 minutes) form a thick layer of Boron doped glass. The dopant is then driven into the semiconductor wafer by ramping up the temperature to drive the Boron from the dopant glass into the wafer. The glass is then etched away prior to a diffusion at an elevated temperature. Two separate furnace cycles with an intermediate etch for dopant glass removal are used in this process.

SUMMARY OF THE INVENTION

It is an object of the present invention to provide increased capacity in a semiconductor manufacturing environment.

It is another object of the present invention to provide a method for carrying out a dopant deposition and oxidation process using a single furnace cycle.

It is a feature that the present invention to provides improved uniformity of the silicon resistance in the processed semiconductor wafers.

It is an advantage that the present invention permits large quantities of wafers to be processed simultaneously thereby increasing the capacity of a semiconductor processing line without significant changes in equipment.

These and other objects, advantages and features of the invention will become apparent to those skilled in the art upon consideration of the following description of the invention.

In one embodiment of the present invention, a method for processing semiconductor wafers in a temperature chamber includes the ordered steps of: heating the chamber to a chamber temperature lower than that which would produce significant diffusion of a dopant in the wafer; maintaining the chamber temperature while forming a layer of dopant glass on the surface of the wafers; increasing the chamber temperature to a diffusion temperature adequate to diffuse the dopant into the wafers in an inert environment; maintaining the diffusion temperature and inert environment for a period of time adequate to diffuse the dopant into the wafers to a desired degree; elevating the chamber temperature to an oxidizing temperature adequate to achieve oxidation of the wafer in an oxidizing environment; and oxidizing the wafer by maintaining the oxidizing temperature and generating the oxidizing environment for a period of time adequate to achieve a desired level of oxidization.

In another aspect of the invention, a semiconductor device is produced by the process of: heating a chamber to a chamber temperature lower than that which would produce significant diffusion of a dopant in the semiconductor device; maintaining the chamber temperature while depositing a layer of the dopant on a surface of the semiconductor device; increasing the chamber temperature to a diffusion temperature adequate to diffuse the dopant into the semiconductor device in an inert environment; maintaining the diffusion temperature and inert environment for a period of time adequate to diffuse the dopant into the semiconductor device to a desired degree; elevating the chamber temperature to an oxidizing temperature adequate to achieve oxidation of the device in an oxidizing environment; and oxidizing the semiconductor device by maintaining the oxidizing temperature and generating the oxidizing environment for a period of time adequate to achieve a desired level of oxidization.

In another method of the present invention for processing semiconductor wafers in a quartz temperature chamber, the method includes the ordered steps of: heating the chamber to a chamber temperature of approximately 850° C; inserting a load of approximately 250 125mm silicon wafers into a center of the chamber; stabilizing the chamber temperature in an gas mixture of approximately 2050 sccm of $N_2$ and 3500 sccm of $O_2$; maintaining the chamber temperature and gas mixture while forming a layer of a dopant glass on the wafers by introducing $POCl_3$ vapor for approximately 75 minutes, wherein the $POCl_3$ vapor is generated by passing the $N_2$ gas through a bubbler containing liquid $POCl_3$ with the liquid $POCl_3$ held at a temperature below ambient temperature; increasing the chamber temperature to a diffusion temperature of approximately 945° C. to diffuse the dopant into the wafers in a nitrogen environment produced by a flow of approximately 6000 sccm of $N_2$; maintaining the diffusion temperature and nitrogen environment for approximately 50 minutes to diffuse the dopant into the wafers to a desired degree; elevating the chamber temperature to an oxidizing temperature of approximately 980° C. in an inert ambient; producing an oxygen and hydrogen environment generated by a flow of approximately 5000 sccm of $H_2$ and 3000 sccm of $O_2$ within the chamber; oxidizing the wafer dopant by maintaining the oxidizing temperature and hydrogen and oxygen environment for a period of time adequate to achieve a desired level of oxidization; reducing the chamber temperature to approximately 800° C.; removing the wafers from the chamber; and introducing an oxygen flow of about 10000 sccm of $O_2$ into the chamber at a chamber temperature of approximately 800° C. into the chamber for at least about 45 minutes to react with any remaining dopant inside the chamber.

Another method for dopant deposition and oxidation of a semiconductor wafer in a single cycle of a furnace, includes the ordered steps of: loading the wafer into a heating chamber of the furnace; depositing a dopant glass on the surface of the wafer; diffusing the dopant into the wafer; oxidizing the dopant; and removing the wafer from the furnace.

A semiconductor device may be produced by a process of the invention including the ordered steps of: loading a semiconductor device into a heating chamber of a furnace; depositing a dopant on the surface of the device; diffusing the dopant into the device; oxidizing the device; and removing the device from the furnace.

The present invention relates to a semiconductor deposition and oxidation process using a single furnace cycle. The temperature and gas mixture is stabilized inside the furnace prior to introduction of a dopant and oxygen at a relatively low temperature. The temperature of the chamber is then ramped-up and the dopant is diffused in an inert ambient. The temperature is then ramped-up again and oxygen is introduced to produce an oxide layer. The wafers are then removed from the furnace and any residue of the dopant within the chamber is effectively neutralized by introducing a high flow of oxygen.

The features of the invention believed to be novel are set forth with particularity in the appended claims. The invention itself however, both as to organization and method of operation, together with further objects and advantages thereof, may be best understood by reference to the following description taken in conjunction with the accompanying drawing.

BRIEF DESCRIPTION THE DRAWINGS

FIG. 1 is a process diagram of an embodiment of the present invention.

DETAILED DESCRIPTION OF THE INVENTION

Figure 1:
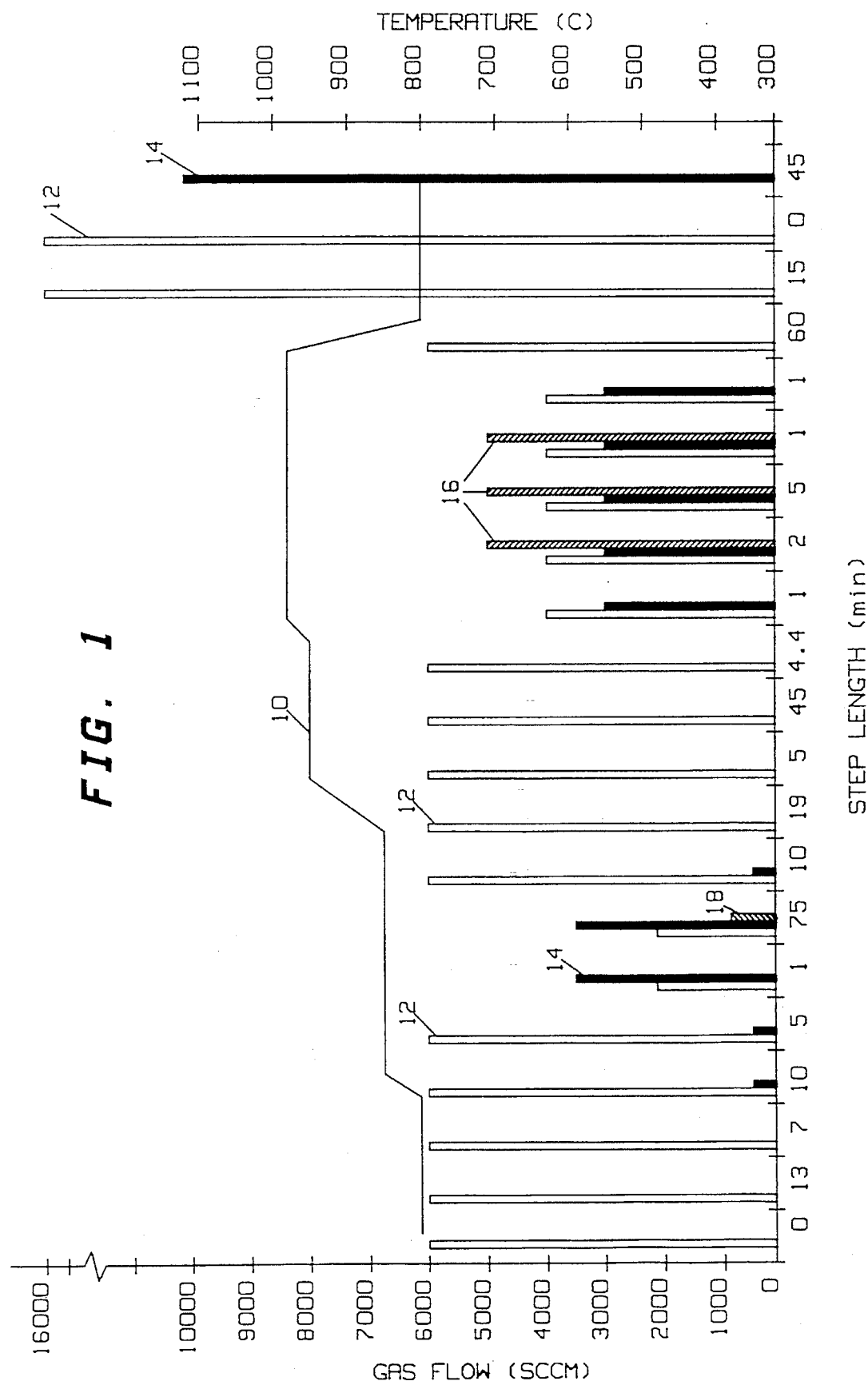

While this invention can be embodied in many different forms, there is shown in the drawing and will herein be described in detail specific embodiments, with the understanding that the present disclosure is to be considered as an example of the principles of the invention and not intended to limit the invention to the specific embodiments shown and described.

Turning now to FIG. 1, the process of the present invention is illustrated in the form of a process diagram. In this diagram, line 10 is a graph of the temperature inside the processing furnace chamber. In the experiments conducted in production of emitters, the processing furnace was a horizontal furnace in which gasses are introduced at one end of a tubular quartz chamber. Heat is generated by resistive heating elements inside the furnace. The left-most bar at each time mark (e.g. 12) represents the gas flow rate of $N_2$ into the chamber. The solid bar adjacent the bars 12 (e.g. 14), represent the gas flow rate of $O_2$ into the chamber. The hashed bars adjacent the solid bars 14 (e.g. 16) represent the gas flow rate of $H_2$ into the chamber. The hashed mark 18, represents the carrier gas flow rate through the $POCl_3$ bubbler (with the bubbler maintained at 20° C.), into the chamber. The time line at the bottom of FIG. 1 describes the step time for each process step.

Table 1 below describes the detailed steps of the present deposition process as shown in FIG. 1.

TABLE 1

| # | Step Time | Temp. °C. | $N_2$ sccm | $O_2$ sccm | $H_2$ sccm | $POCl_3$ sccm | Remarks |
|---|-----------|-----------|-----------|-----------|-----------|--------------|---------|
| 1 | 0.0 | 800 | 6000 | 0 | 0 | 0 | initial conditions |
| 2 | 13.0 | 800 | 6000 | 0 | 0 | 0 | push |
| 3 | 7.0 | 800 | 6000 | 0 | 0 | 0 | temp. stabilize |
| 4 | 10.0 | 800→850 | 6000 | 350 | 0 | 0 | ramp up 5.0° C./min. |
| 5 | 5.0 | 850 | 6000 | 350 | 0 | 0 | temp. stabilize |
| 6 | 1.0 | 850 | 2050 | 3500 | 0 | 0 | gas switch |
| 7 | 75.0 | 850 | 2050 | 3500 | 0 | 750 | deposit |
| 8 | 10.0 | 850 | 6000 | 350 | 0 | 0 | gas switch |
| 9 | 19.0 | 850→945 | 6000 | 0 | 0 | 0 | ramp up 5.33° C./min |
| 10 | 5.0 | 945 | 6000 | 0 | 0 | 0 | temp. stabilize |
| 11 | 45.0 | 945 | 6000 | 0 | 0 | 0 | drive |
| 12 | 4.4 | 945→980 | 6000 | 0 | 0 | 0 | ramp up 8.0° C./min |
| 13 | 1.0 | 980 | 4000 | 3000 | 0 | 0 | gas switch |
| 14 | 2.0 | 980 | 4000 | 3000 | 5000 | 0 | gas switch |
| 15 | 5.0 | 980 | 0 | 3000 | 5000 | 0 | oxidize |
| 16 | 1.0 | 980 | 4000 | 3000 | 5000 | 0 | gas switch |
| 17 | 1.0 | 980 | 4000 | 3000 | 0 | 0 | gas switch |
| 18 | 60.0 | 980→800 | 6000 | 0 | 0 | 0 | ramp down 3.0° C./min |
| 19 | 15.0 | 800 | 16000 | 0 | 0 | 0 | pull |

TABLE 1-continued

| # | Step Time | Temp. °C. | N₂ sccm | O₂ sccm | H₂ sccm | POCl₃ sccm | Remarks |
|---|---|---|---|---|---|---|---|
| 20 | 0.0 | 800 | 16000 | 0 | 0 | 0 | unload |
| 21 | 45.0 | 800 | 0 | 10000 | 0 | 0 | push and O₂ burn |

Step 1 describes the starting conditions in the chamber at the start of the present process. At this point, the chamber is brought to 800° C. with 6000 sccm (standard cubic centimeters per minute) of $N_2$ flowing through the chamber. The furnace chamber itself is a cylindrical quartz chamber arranged horizontally and heated by electrical resistance. At step 2, over a period of approximately 13 minutes in the present case, a load of 250 wafers is pushed into the furnace chamber. The wafers are arranged so that they are perpendicular to the flow of gasses in the chamber. The wafers are initially at room temperature and are arranged on a cantilever in five contiguous "boats" of 50 wafers each. A sixth position (away from the gas stream introduction) on the cantilever is filled by a thermal mass. During the present step, the cantilever is maneuvered into the quartz chamber centering the entire wafer load in the chamber.

Once all of the wafers are inserted within the chamber, the temperature is allowed to stabilize for a period of at least about 7.0 minutes at step 3 so that the temperature profile across the wafers in the chamber is nearly uniform. At step 4, the temperature is then ramped up to about 850° C. over a period of 10 minutes (approximately linearly at 5° C. per minute) while introducing an additional flow of about 350 sccm of $O_2$ in order to form a thin screening oxide layer on the silicon wafers. This screening oxide provides a barrier to the dopant diffusion and reduces damage to the crystalline structure of the silicon wafer when the dopant is later diffused. Once the ramp-up of step 4 is complete, conditions within the furnace are once again permitted to stabilize for approximately 5 minutes at step 5 so that the temperature of the chamber is uniform.

At step 6, the $N_2$ and $O_2$ mixture is changed for a flow of approximately 2050 and 3500 sccm respectively and held at this level for approximately 1 minute to make the transition in gas mixture in the chamber for the next step. Then, at step 7, the dopant glass is formed on the wafer by introducing a flow of about 750 sccm of Nitrogen carrier gas bubbled through 20° C. liquid $POCl_3$ thereby introducing $POCl_3$ vapor into the chamber for a period of about 75 minutes. The $POCl_3$ is maintained in liquid form at approximately 20° C. inside a bubbler. This assures that the $POCl_3$ remains in vapor form when transported from the bubbler to the furnace (i.e. the vapor does not condense in the line to the furnace due to a lower ambient temperature). The processing parameters of the deposition step (as well as other process parameters) are selected to eventually obtain a target range of silicon resistance of approximately 2.0±0.4 Ω and approximately 2200±400 Å of oxide thickness and to obtain the best gas flows for uniformity within individual wafers and across the load of 250 wafers, each 125 mm in diameter. For other target values, the processing parameters of this step can be adjusted.

At this point, a relatively large quantity of the dopant has been distributed uniformly onto the surface of the wafers in the form of dopant glass ($P_2O_5$), but very little of the dopant will have diffused from the dopant glass into the silicon at this temperature since this temperature is below that which rapidly produces significant diffusion. It is not believed that the quantity of dopant has reached the point of solid solubility at this stage, but still a large quantity of dopant is present on the surface of the wafers. If the desired target resistance is lower or higher than the present target value, the time or ambient of step 7 can be increased or decreased respectively to adjust the amount of dopant to achieve the desired target resistance.

Once the deposition time of step 7 has expired, the gas flow of $N_2$ is switched to 6000 sccm, the flow of $O_2$ is switched to 350 sccm and the flow of dopant is terminated at step 8. These conditions are held for 10 minutes at step 8 to oxidize any unreacted residual $POCl_3$ on the surface of the wafers.

At step 9, the process of driving the dopant into the surface of the semiconductor is begun with a uniform ramp-up of the temperature from 850° C. to about 945° C. at a rate of about 5° C./minute over 19 minutes with 6000 sccm of $N_2$ being the only gas flowing into the chamber at this point. The temperature stabilizes over the next five minutes or so as shown in step 10. Step 11 is shown as the actual drive-in step where bulk of the dopant is driven into the silicon by maintaining this temperature and gas flow for approximately 45 minutes. At this temperature, the dopant readily diffuses into the silicon wafer.

Step 11 can be adjusted to obtain other target resistances by varying the time of the step. If the desired target resistance is lower or higher than the present target value, the time of step 11 can be increased or decreased respectively to adjust to the desired target resistance. Other parameters could, of course, also be varied to obtain these or other desired target results.

In some processes, for example when a Boron dopant is used (or for other processes where it might be deemed advisable or necessary), the temperature can be ramped down at this point and the wafers removed from the furnace for an etch step. When Boron is used as a dopant, often a Boron glass skin $B_2O_3$ forms which is generally removed by etching. After such an etch is completed, the wafers can then be put back into the furnace for the steps to follow. Appropriate temperature ramp-ups, ramp-downs and stabilizing steps should be inserted if the wafers are removed at this point. For the preferred process, and many others, this intermediate etching process is not required.

At step 12, the temperature is again ramped up for the oxidation steps to follow. The temperature is stepped up over a 4.4 minute period at a rate of 8° C./minute to a temperature of about 980° C. at which temperature oxidation readily occurs. Next at steps 13 and 14, the gas mixture is transitioned to the desired mixture of 3000 sccm of $O_2$ and 5000 sccm of $H_2$ over a period of 3 minutes in preparation for the oxidization of step 15. These conditions are held for 5.0 more minutes at step 15 to obtain the desired level of oxidation. If held for longer than this time, the silicon resistance will decrease below the target level and the oxide layer will be thicker than the desired target. The two step transition is done in the particular hardware used for these experiments to prevent ignition of the hydrogen—oxygen mixture in the gas lines. In other hardware, the transition could possibly be done differently.

For similar reasons, the hydrogen and oxygen mixture is transitioned in two steps at steps 16 and 17 to achieve a pure nitrogen gas flow. At step 18, the temperature is ramped down at rate of about 3° C./minute to about 800° C. over the next hour. This temperature is low enough to prevent warping damage of the 125 mm wafers when removed from the furnace into room conditions. For other size wafers, a different temperature may be appropriate. At step 19, the boats of wafers are extracted via cantilever out of the chamber and unloaded into carriers in preparation for evaluation and the next set of processes.

Since the present process carries out deposition and oxidization in a single furnace cycle, a resultant residue of dopant remains on the chamber walls as well as on the cantilever, thermal mass and boats. To prevent this residue from contaminating future process batches, the boats and thermal mass are reloaded onto the cantilever and reloaded into the chamber at step 21. The chamber is then flooded with oxygen (at least about 10,000 sccm of $O_2$) for about 45 minutes to react with and effectively neutralize any remaining dopant in the chamber, on the boats, thermal mass, and cantilever, etc.

In the above process, steps 1–3, 9–12 and 18–20 are carried out in a pure nitrogen environment. Other inert gasses could also be used. The flow rate disclosed is for the particular equipment used and can readily be adjusted to achieve a pure nitrogen environment. Too high a flow rate may affect the temperature stability in the chamber while too low a flow rate may allow room ambient backstreaming and may not produce the desired pure nitrogen environment.

Steps 1–3 are carried out in any suitable temperature for inserting (pushing) wafers into the chamber (typically 500 to 850 degrees). The ramp up time of step 4 is not critical. The deposition temperatures of steps 4-8 can be in the range of approximately 700 to 900 degrees for various processes. Similarly, the drive temperature for steps 9–11 may range from about 900 to 1100 degrees. The parameters of temperature, time and gas mixture for steps 7 and 15 were optimized to achieve the desired parametric targets in silicon resistance.

The oxidizing temperature of steps 12–17 can range from about 800 to 1250 degrees. The mixture of oxygen and hydrogen can also be varied. Pure oxygen could be used or a mixture of hydrogen to oxygen so long as the proportion of hydrogen to oxygen is maintained at a ratio of less than 2 to 1 to avoid the danger of excess hydrogen. The range of temperatures of steps 18–21 is similar to that of steps 1–3. The burn step 21 can be carried out at any temperature between about 650 and 1100. Of course, when any of the above conditions are changed (e.g. temperature or gas mixture), corresponding changes in other conditions (e.g. time) may be used to compensate and achieve the desired results as will be appreciated by those skilled in the art. Therefore, the exact parameters specified on the table should be considered a starting point for implementing the process on any equipment other than the exact equipment used in developing the present invention.

Those skilled in the art will understand that many variables influence the process described. Further optimization of the process may be possible by variation of times, temperatures, gas mixtures, number and arrangement of wafers, and flow rates, etc. These parameters can, of course, also be varied to produce other target parameters in the resultant wafer. The above parameters may be varied or changed in an offsetting manner in many cases without departing from the present invention. Also, although the present invention has been described in terms of use of a $POCl_3$ as a dopant source, there is reason to believe that the same process with suitable adjustments in the gas mixtures and flow rates and exact temperatures would be equally applicable to other dopant sources such as Boron, Arsenic, Antimony, other forms of Phosphorous, etc.

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A method for processing semiconductor wafers in a single cycle of a temperature chamber without removal of the wafers, comprising the ordered steps of:

heating said chamber to a chamber temperature lower than which would produce diffusion of a dopant in said wafer;

maintaining said chamber temperature while forming a layer of dopant glass on a surface of said wafers;

increasing said chamber temperature to a diffusion temperature to drive said dopant into said wafers in an inert environment;

maintaining said diffusion temperature and inert environment for a period of time to drive said dopant into said wafers;

elevating said chamber temperature to an oxidizing temperature and generating said oxidizing environment for a period of time to achieve oxidation of said wafer.

2. The method of claim 1, further comprising the steps of:

ramping down the temperature inside said chamber to a temperature low enough to prevent damage to said wafers if removed from said chamber;

removing said wafers from said chamber; and introducing an oxidizing flow into said chamber for a period of time for reacting with and oxidizing any remaining dopant inside said chamber.

3. The method of claim 1, further comprising the step of stabilizing the temperature and gas mixture inside said chamber prior to the step of forming said dopant glass.

4. The method of claim 1, wherein said step of forming said dopant glass includes introducing $POCl_3$ vapor into said chamber at 2050 sccm $N_2$ and 3500 sccm $O_2$ for 75 minutes.

5. The method of claim 1, wherein said oxidizing temperature is 980° C. and wherein generating said oxidizing environment during said oxidizing step includes providing a flow of 5000 sccm of $H_2$ and 3000 sccm of $O_2$ within said chamber.

6. The method of claim 2, wherein said step of introducing an oxidizing flow includes the step of introducing a flow of 10,000 sccm or greater of $O_2$ into said chamber at 800°0 C. for about 45 minutes.

7. The method of claim 4, wherein said $POCl_3$ vapor is produced by passing an inert carrier gas through a bubbler containing $POCl_3$ in liquid state.

8. The method of claim 7, wherein said carrier gas is $N_2$ flowing at a rate of 225 sccm through said bubbler.

9. The method of claim 7, wherein said $POCl_3$ in liquid state is maintained at a temperature below ambient room temperature.

10. The method for processing semiconductor wafers in a quartz temperature chamber using a single furnace cycle, comprising the ordered steps of:

heating said chamber to a chamber temperature of approximately 850° C.;

inserting a load of a plurality 125 mm silicon wafers into a center of said chamber;

stabilizing said chamber temperature in a gas mixture of 2050 sccm of $N_2$ and 3500 sccm of $O_2$;

maintaining said chamber temperature and gas mixture while forming a layer of a dopant glass on said wafers by introducing $POCl_3$ vapor for 75 minutes, wherein said $POCl_3$ vapor is generated by passing said $N_2$ gas through a bubbler containing liquid $POCl_3$ with said liquid $POCl_3$ held at a temperature below ambient temperature;

increasing said chamber temperature to a diffusion temperature of 945° C. to diffuse said dopant into said wafers in a nitrogen environment produced by a flow of 6000 sccm of $N_2$;

maintaining said diffusion temperature and nitrogen environment for 50 minutes to drive said dopant into said wafers;

elevating said chamber temperature to an oxidizing temperature of 980° C. in an inert ambient;

generating an oxygen and hydrogen environment by establishing a flow of 5000 sccm of $H_2$ and 3000 sccm of $O_2$ within said chamber;

oxidizing said wafers by maintaining said oxidizing temperature and hydrogen and oxygen environment for a period of time to achieve oxidization of said wafers;

reducing said chamber temperature to 800° C.;

removing said wafers from said chamber; and introducing an oxygen flow of about 1000 sccm of $O_2$ at a chamber temperature of 800° C. into said chamber for at least about 45 minutes to react with any remaining dopant inside said chamber.

11. A method for processing semiconductor wafers in a temperature chamber using a single furnace cycle, comprising the ordered step of:

establishing a target silicon resistance for said wafers;

heating said chamber to a chamber temperature;

maintaining said chamber temperature while forming a layer of dopant glass on a surface of said wafers;

said chamber temperature being too low to cause diffusion of said dopant in said wafer to a degree which would produce a silicon resistance which is less than said target said target resistance;

increasing said chamber temperature to a diffusion temperature to drive said dopant into said wafers in an inert environment;

maintaining said diffusion temperature and inert environment for a period of time to drive said dopant into said wafers to produce said target silicon resistance;

elevating said chamber temperature to an oxidizing temperature to achieve oxidation of said wafer in an oxidizing environment; and oxidizing said wafer by maintaining said oxidizing temperature and generating said oxidizing environment for pre-established period to time to achieve a target level of oxidization.

12. The method of claim 11, further comprising the steps of:

ramping down the temperature inside said chamber to a temperature low enough to prevent damage to said wafers if removed from said chamber;

removing said wafers from said chamber; and introducing an oxidizing flow into said chamber for a period of time for reacting with any remaining dopant inside said chamber.

13. The method of claim 11, further comprising the step of stabilizing the temperature and gas mixture inside said chamber prior to the step of forming said dopant glass.

14. The method of claim 11, wherein said step of forming said dopant glass includes introducing $POCl_3$ vapor into said chamber at 700° to 900° C. in a gas mixture of $N_2$ and $O_2$.

15. The method of claim 11, wherein said oxidizing temperature is 980° C. and wherein generating said oxiding environment during said oxiding step includes providing a flow of 5000 sccm of $H_2$ and 3000 sccm of $O_2$ within said chamber.

16. The method of claim 11, wherein said step of introducing an oxidizing flow includes the step of introducing a flow of 10,000 sccm or greater of $O_2$ into said chamber at 800° C. for 45 minutes.

17. The method of claim 14, wherein said $POCl_3$ vapor is produced by passing an inert carrier gas through a bubbler containing $POCl_3$ in liquid state.

18. The method of claim 17, wherein said carrier gas is $N_2$ flowing at a rate of 225 sccm through said bubbler.

19. The method of claim 17, wherein said $POCl_3$ in liquid state is maintained at a temperature below ambient room temperature.

20. A method for processing semiconductor wafers in a quartz temperature chamber, comprising the ordered steps of;

heating said chamber to a chamber temperature of 850° C.;

inserting a load of silicon wafers into a center of said chamber;

stabilizing said chamber temperature in an gas mixture of 2050 sccm of $N_2$ and 3500 sccm of $O_2$;

maintaining said chamber temperature and gas mixture while forming a layer of a dopant glass on said wafers by introducing $POCl_3$ vapor for 75 minutes, wherein said $POCl_3$ vapor is generated by passing said $N_2$ gas through a bubbler containing liquid $POCl_3$ with said liquid $POCl_3$ held at a temperature below ambient temperature;

increasing said chamber temperature to a diffusion temperature of 900° to 1100° C. to diffuse said dopant into said wafers in a nitrogen environment produced by a flow of 6000 sccm of $N_2$;

maintaining said diffusion temperature and nitrogen environment for 50 minutes to diffuse said dopant into said wafers;

generating an oxygen and hydrogen environment by establishing a flow of 5000 sccm of $H_2$ and 3000 sccm of $O_2$ within said chamber;

oxidizing said wafer by maintaining said diffusion temperature and hydrogen and oxygen environment for a period of time to achieve oxidization of said wafers;

reducing said chamber temperature to 800° C.;

removing said wafers from said chamber; and introducing an oxygen flow of 10000 sccm of $O_2$ at a chamber temperature of 800° C. into said chamber for at least 45 minutes to react with any remaining dopant inside said chamber.

\* \* \* \* \*